(12) United States Patent
Taft et al.

(10) Patent No.: US 6,822,600 B1
(45) Date of Patent: Nov. 23, 2004

(54) AMPLIFIER ARRAY TERMINATION

(75) Inventors: Robert C. Taft, Munich (DE);
Christopher A. Menkus, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/816,293

(22) Filed: Mar. 30, 2004

Related U.S. Application Data

(60) Provisional application No. 60/544,660, filed on Feb. 13, 2004.

(51) Int. Cl.[7] ................................................ H03M 1/12
(52) U.S. Cl. ......................... 341/155; 341/159; 341/158
(58) Field of Search ................................. 341/155, 156, 341/120, 158, 159, 139, 161

(56) References Cited

U.S. PATENT DOCUMENTS 6,072,416 A * 6/2000 Shima ........................ 341/159
6,100,836 A * 8/2000 Bult ............................ 341/155
6,369,732 B1 * 4/2002 Liu et al. .................... 341/143

* cited by examiner

Primary Examiner—Michael Tokar
Assistant Examiner—John B Nguyen
(74) Attorney, Agent, or Firm—Darby & Darby PC; John W. Branch

(57) ABSTRACT

A method and circuit for terminating a pre-amplification array for stable linearity of a folding or flash analog-digital-converter (ADC) circuit over a temperature range. Termination resistors with pre-selected temperature coefficients are coupled between outputs of a first and a last amplifier of an amplifier bank in an averaged pre-amplification stage and a termination voltage source. The termination resistors and the termination voltage provide a current that compensates temperature dependent changes in the current flowing from other amplifiers outputs towards the output of the first and last amplifiers stabilizing linearity when temperature changes. Multiple termination resistors with different temperature coefficients may be employed to better approximate the desired temperature coefficient for optimum performance.

21 Claims, 5 Drawing Sheets

AMPLIFIER ARRAY TERMINATION

RELATED APPLICATION

This application claims the benefit of U.S. Provisional Application Ser. No. 60/544,660 filed Feb. 13, 2004, the benefit of the earlier filing date of which is hereby claimed under 35 U.S.C. § 119 (e).

FIELD OF THE INVENTION

The present invention relates to analog-to-digital conversion, and, in particular, to a circuit and method of terminating an amplifier array in a folding or a flash type analog-digital-converter for temperature stability.

BACKGROUND

An analog-digital-converter (ADC) is employed to change/convert an analog input signal into a digital output signal. There are several different types of ADC architectures in current use, including pipeline, flash and folding. In a flash ADC, k bits of resolution employ $2^k$ comparators to convert an analog signal into a digital signal. Folding ADCs are a variation of a typical flash ADC architecture except that they are arranged to map the analog input signal range into N regions where each of these N regions share the same comparators. In a folding ADC, the total number of comparators is typically $2^k/N+(N-2)$.

Flash and folding ADCs may be scaled to very high conversion speeds, since they do not use decision feed-back loops. These two architectures, unfortunately, can be sensitive to device mismatch, leading to linearity degradation. This is especially true of CMOS folding ADCs, since CMOS devices have larger offsets than bipolar devices.

Thus, it is with respect to these considerations and others that the present invention has been made.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION

Figure 1:
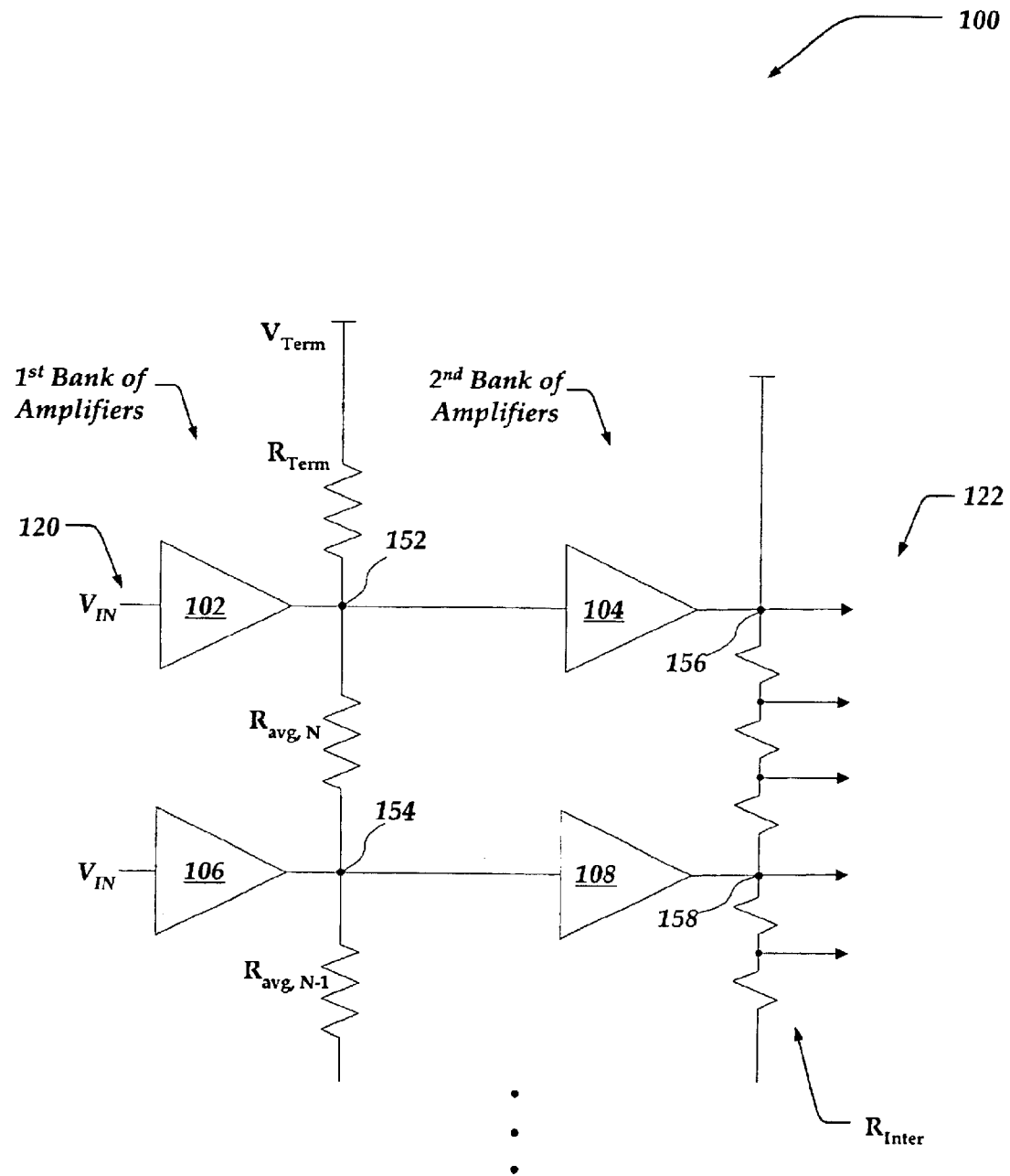
FIG. 1 illustrates an exemplary single-ended embodiment of the present invention in a pre-amplification circuit of a folding ADC.

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

The terms "comprising," "including," "containing," "having," and "characterized by," refers to an open-ended or inclusive transitional construct and does not exclude additional, unrecited elements, or method steps. For example, a combination that comprises A and B elements, also reads on a combination of A, B, and C elements.

The meaning of "a," "an," and "the" include plural references. The meaning of "in" includes "in" and "on." Additionally, a reference to the singular includes a reference to the plural unless otherwise stated or is inconsistent with the disclosure herein.

The term "or" is an inclusive "or" operator, and includes the term "and/or," unless the context clearly dictates otherwise. The phrase "in one embodiment," as used herein does not necessarily refer to the same embodiment, although it may. The term "based on" is not exclusive and provides for being based on additional factors not described, unless the context clearly dictates otherwise.

The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

An ADC may have multiple levels of pre-amplification. Multiple banks of amplifiers may have their output averaged to reduce the effect of offset errors. An amplifier with a large offset may be pulled into line by neighboring amplifiers using the resistors tying their outputs together. Since the outputs of the one amplifier bank feed into the next amplifier bank inputs, the next bank also has averaging. Furthermore, calibration methods, such as injection of an adjustment current through a series adjustment resistor at the input of an amplifier, may be employed as well. However, different temperature dependencies of resistors and amplifier transconductances may result in distortion of the linearity of transfer curve.

Briefly stated, the present invention is related to improving linearity in a folding or flash analog-digital-converter by providing temperature stability. One or more termination resistors are coupled between an output of a first amplifier of an averaged amplifier bank and a termination voltage. By pre-selecting a temperature coefficient of the termination resistor to compensate for linearity changes in the pre-amplification circuit, a stable transfer curve may be obtained during operation of the ADC.

FIG. 1 schematically illustrates an exemplary embodiment of pre-amplification circuit 100 of a folding ADC. Pre-amplification circuit 100 is configured to receive a single-ended analog signal ($V_{IN}$) at an input of amplifiers 102 and 106. Amplifiers 102 and 106 are representative of a number of amplifiers forming first bank of amplifiers. The total number of amplifiers in the first bank of amplifiers is determined based, in part, on a desired resolution of a digital output signal of the ADC. Typically k bits of resolution requires $2^k$ amplifiers in the first bank of amplifiers.

A termination resistor ($R_{Term}$) is coupled between a termination voltage source and an output of amplifier 102 at node 152. Outputs of representative amplifiers 102 and 106 are connected through averaging resistor $R_{avg,\ N}$ between nodes 152 and 154. Nodes 152 and 154 are further connected to an input of representative amplifiers 104 and 108 of second bank of amplifiers. In one embodiment, an output of amplifier 104 is connected through at least three interpolation resistors ($R_{inter}$) to the outputs of other amplifiers in the second bank of amplifiers. Output 122 is connected to an input of a comparator circuit (not shown).

The above described connection of representative amplifier 102 through node 152, and amplifier 104 to the output, is repeated similarly for amplifiers 106 and 108. As mentioned above amplifiers 106 and 108 are connected to other amplifiers in their respective banks through further averaging and interpolation resistors. Amplifier 102 is a first amplifier in first bank of amplifiers. The output of a last amplifier (not shown) of the first bank of amplifiers is also coupled through a termination resistor to another terminal of the termination voltage source.

In one embodiment, an analog signal ($V_{IN}$) is provided to the first bank of amplifiers through input 120 from a track-and-hold circuit (not shown). Amplification in the first bank of amplifiers, averaging by the averaging resistors, and amplification by the second bank of amplifiers subjects the analog signal to offset errors. Amplifier and comparator offsets, as well as mismatch in resistor values and current mirror ratios, can all contribute to the total offset error. There may be a variety of solutions to compensate for offset error, such as injection of the adjustment current $I_{adj,\ N}$ through adjustment resistor $R_{adj,\ N}$ connecting each amplifier of the first and second bank of amplifiers. However, such calibration techniques do not generally provide stable linearity over a wide temperature range. This may be due to a cumulative "pulling" effect of many neighboring amplifiers changing with temperature, termination voltage, ($V_{Term}$) not remaining constant over temperature due to its unique non-idealities, a gain of the amplifiers in the amplifier bank changing with temperature, and the like. These factors lead to a temperature dependent increase of the current flowing towards the output of the first amplifier at node 152 from the other amplifiers in the amplifier bank. Coupling a termination resistor $R_{Term}$ to the output of the first amplifier generates a reverse current flowing into node 152. A temperature coefficient of termination resistor $R_{Term}$ may be pre-selected such that a temperature dependence of the reverse current substantially compensates for the temperature dependence of the current flowing from the other amplifiers to the output of the first amplifier. Thus, pre-selecting a temperature coefficient of the termination resistor $R_{Term}$ provides stabilization of linearity for the ADC over the temperature range.

In one embodiment the termination resistor $R_{Term}$ may be a single resistor. In another embodiment, the termination resistor $R_{Term}$ may be a composite resistor comprising two or more resistors arranged such that the total temperature coefficient of the composite resistor substantially the same as the desired temperature coefficient.

Although FIG. 1 shows interpolation resistors connecting outputs of amplifiers of the second amplifier bank, in another embodiment, outputs of the second bank amplifiers may be connected through averaging resistors. In yet another embodiment, there may be no resistors between the outputs of second bank amplifiers. A further embodiment of the ADC may only have one bank of amplifiers with averaging and termination resistors.

Figure 2:
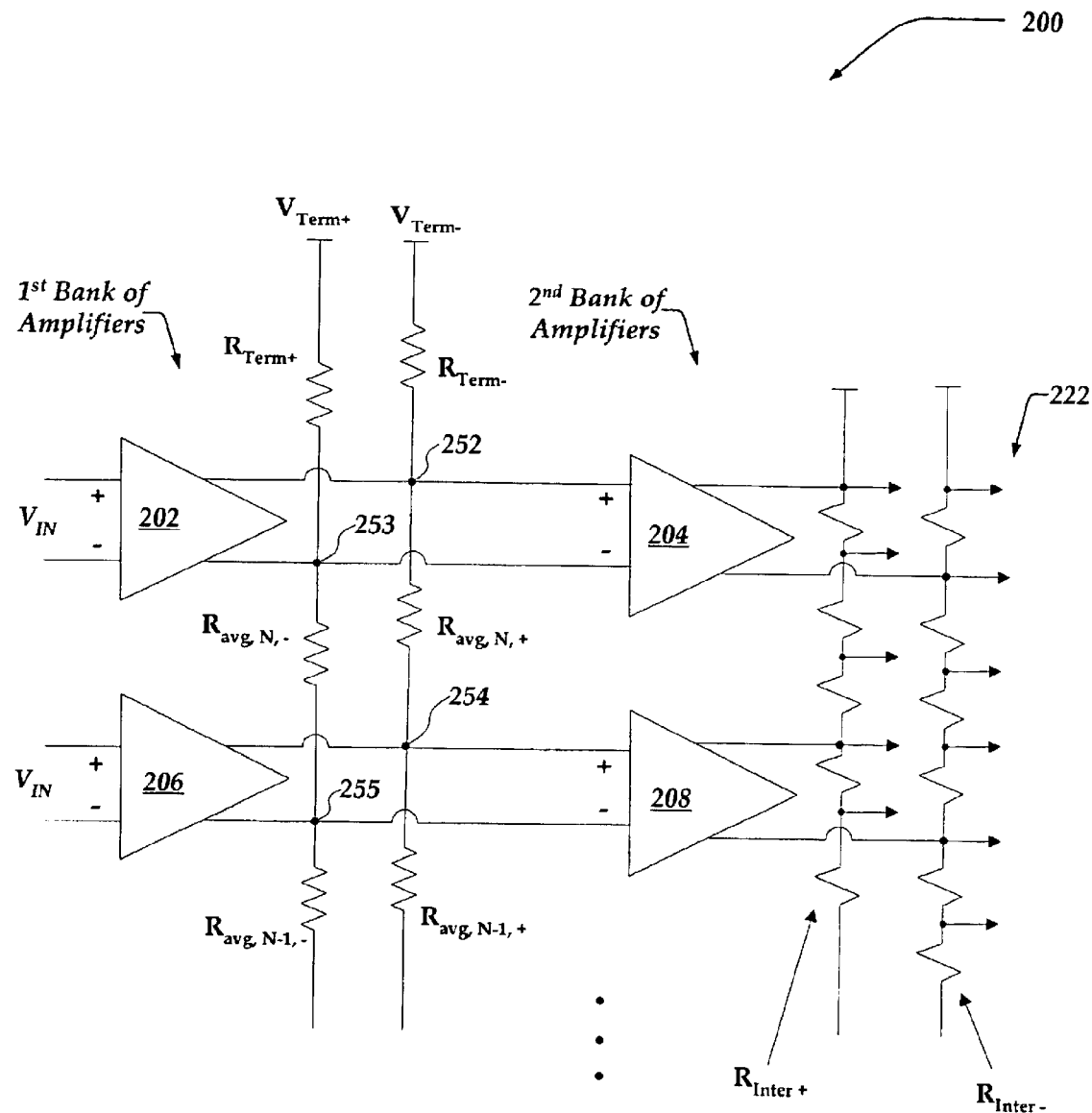
FIG. 2 illustrates an exemplary differential embodiment of the present invention in a pre-amplification circuit of a folding ADC.

FIG. 2 schematically illustrates an exemplary embodiment of pre-amplification circuit 200. Pre-amplification circuit 200 is configured to receive a differential analog signal ($V_{IN}$) at the inputs of amplifiers 202 and 206. Similar to FIG. 1, amplifiers 202 and 206 are representative of a number of amplifiers forming first bank of amplifiers. Similarly, amplifiers 204 and 208 are representative for the number of amplifiers in the second bank of amplifiers. The second bank of amplifiers is a folding stage. Nodes 252 and 253 connect averaging resistors $R_{avg,\ N+}$ and $R_{avg,\ N-}$ with respective outputs of amplifier 202. Termination resistors $R_{Term+}$ and $R_{Term-}$ are further coupled between outputs of amplifier 202 and terminals of the termination voltage source. Outputs of amplifier 204 are connected to other amplifiers of the second bank of amplifiers, such as amplifier 208, through interpolation resistors ($R_{inter}$). Folded outputs of pre-amplification circuit 200 are connected to a comparator circuit (not shown).

Similar to FIG. 1, the pre-amplification sequence described above is repeated in FIG. 2 as well. In another embodiment pre-amplification circuit 200 may have at least one additional bank of amplifiers between the first bank and the second bank. In yet another embodiment, the additional bank of amplifiers may have additional averaging resistors similar to the configuration described above. In a further embodiment, the additional bank of amplifiers may have interpolation resistors coupled to its outputs in place of averaging resistors.

Figure 3:
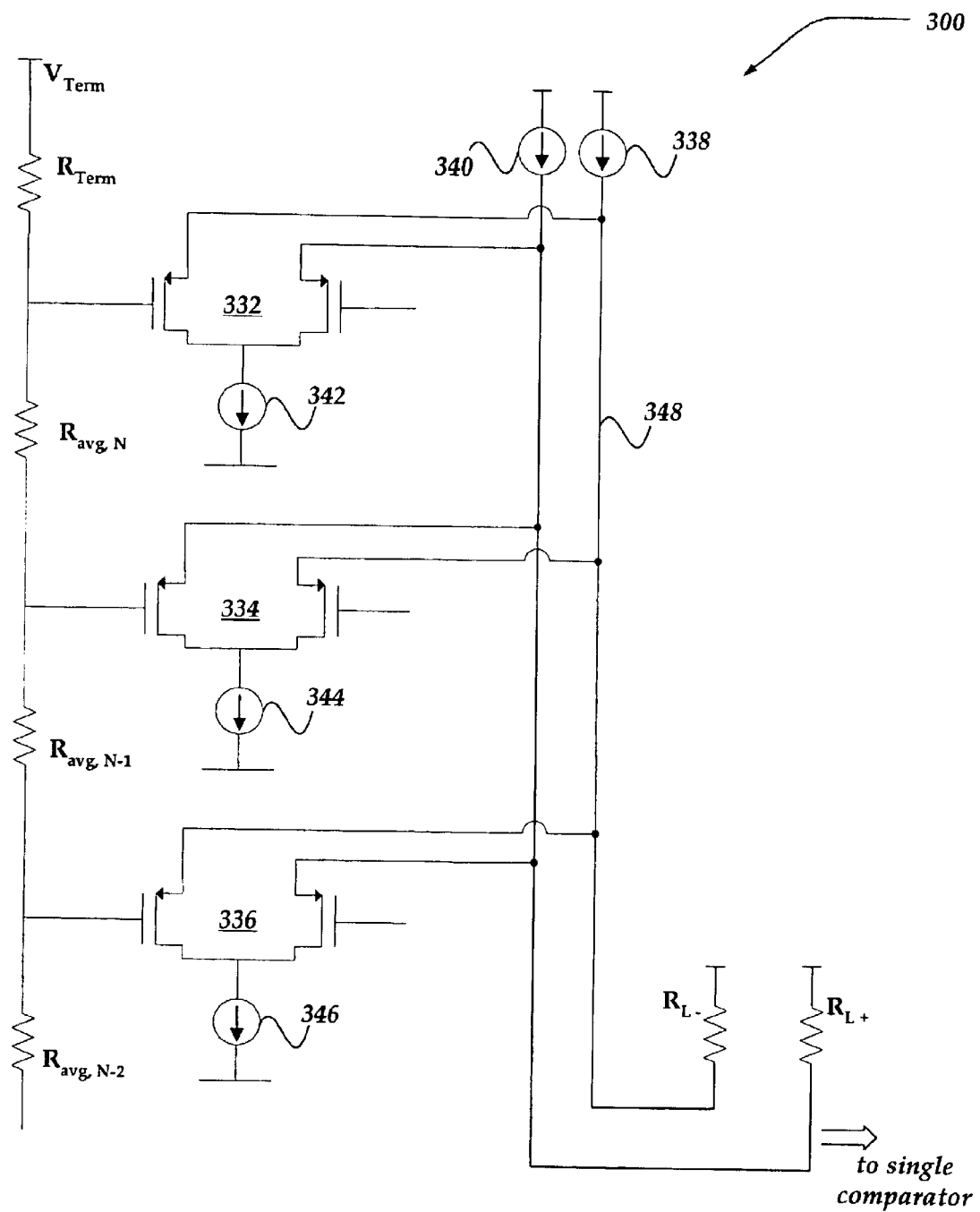
FIG. 3 illustrates an exemplary amplifier circuit in accordance with an embodiment of the present invention.

FIG. 3 illustrates a more detailed schematic of one embodiment of amplifier triplet 300 in accordance with the present invention, such as those in second amplifier bank in FIG. 2. Amplifier triplet 300 includes current sources 338 and 340 connected to parallel transistor pairs 332, 334, 336. Averaging resistors $R_{avg,\ N+}$, $R_{avg,\ N-}$, and the like, connect inputs of individual transistors in amplifier triplet 300 (only one set of averaging resistors shown). A termination resistor connects each input of first transistor pair 332 to the terminals of a termination voltage source ($V_{Term}$). Current sources 342, 344, 346 connect the transistor pairs to ground. The outputs of transistor pairs 332, 334, 336 are connected through folding bus 348 to a single comparator in a comparator circuit or an input of an amplifier in a further pre-amplification circuit.

The temperature coefficient of the termination resistor is pre-selected as described above. In one embodiment, all three transistor pairs are coupled to an input of a single comparator. In another embodiment, a ratio of amplifiers to comparators may be determined based, in part, on a desired resolution of a digital output signal of the ADC. In yet another embodiment, a composite termination resistor may be employed, as described above, for optimum stability.

Figure 4:
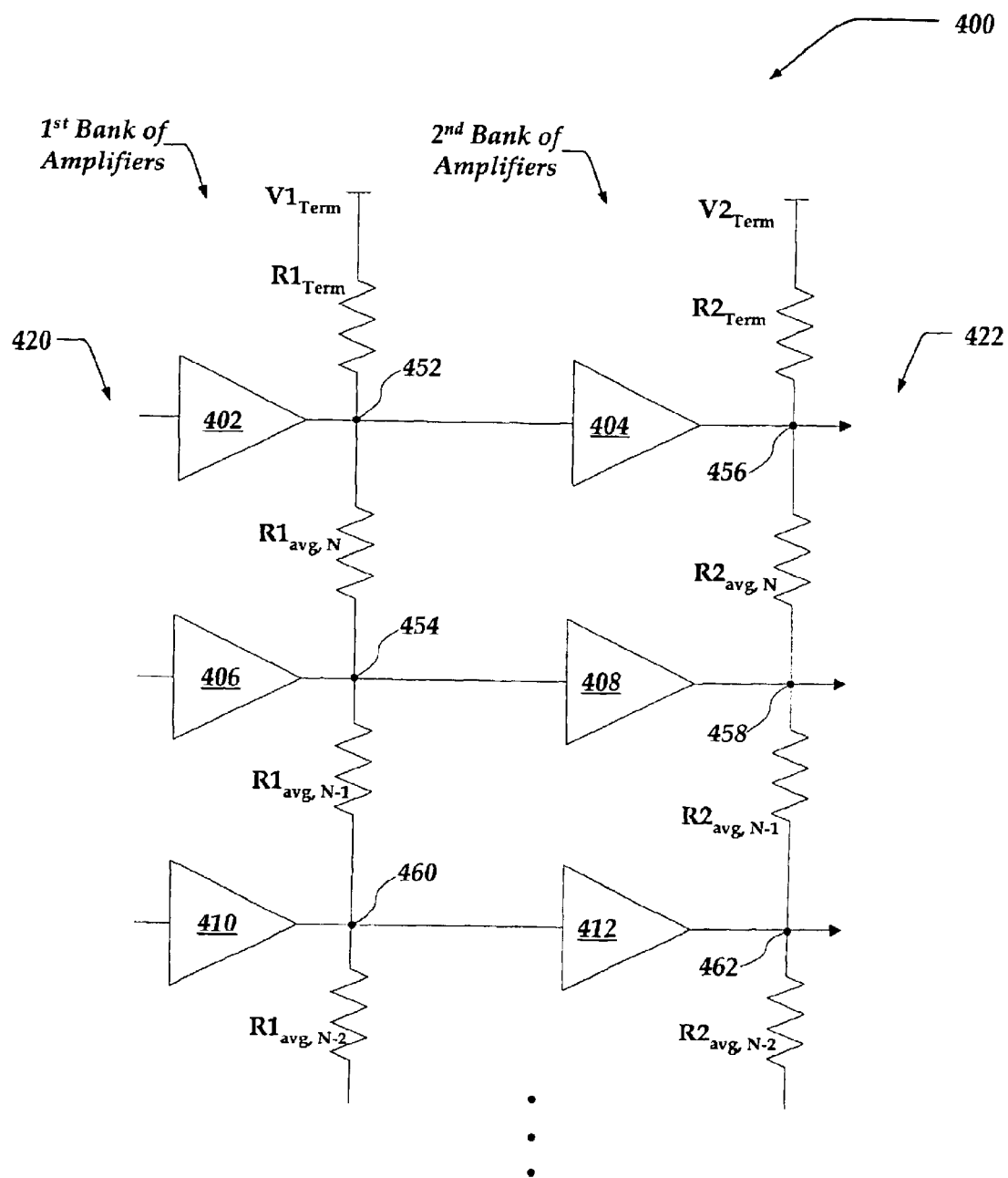
FIG. 4 illustrates an exemplary single-ended embodiment of the present invention in a pre-amplification circuit of a flash ADC.

FIG. 4 schematically illustrates an exemplary embodiment of pre-amplification circuit 400 of a flash ADC. Pre-amplification circuit 400 is configured to receive a single-ended analog signal at input 420 of amplifiers 402, 406, and 410. Amplifiers 402, 406, and 410 are representative of a number of amplifiers forming first bank of amplifiers. The total number of amplifiers in the first bank of amplifiers is determined based, in part, on a desired resolution of a digital output signal of the ADC.

The outputs of representative amplifiers 402 and 406 are connected through averaging resistor $R1_{avg,\ N}$ between nodes 452 and 454. Nodes 452 and 454 are further connected to an input of representative amplifiers 404 and 408 of second bank of amplifiers. An output of amplifier 404 is connected through node 456, which connects the outputs of other amplifiers in the second bank of amplifiers through averaging resistors, to output 422. Output 422 is connected to an input of a comparator circuit (not shown). First amplifiers in both banks are amplifiers 402 and 404. The outputs of amplifiers 402 and 404 are coupled through termination resistors $R1_{Term}$ and $R2_{Term}$, respectively, to a terminal of termination voltage source.

The above described connection of representative amplifier 402 through node 452 and amplifier 404 to the output, is repeated for amplifiers 406 and 408. As mentioned above amplifiers 406 and 408 are connected to other amplifiers in their respective banks through further averaging resistors.

In one embodiment, an analog signal ($V_{IN}$) is provided to the first bank of amplifiers through input 420 from a track-and-hold circuit (not shown). The signal is processed in pre-amplification circuit 400 as described in FIG. 1, and provided to the comparator circuit, wherein the termination of the output of the first amplifier bank through termination resistor $R_{Term}$ provides a substantially stable analog-to-digital transfer curve over a temperature range for the flash ADC employing pre-amplification circuit 400. In another embodiment, pre-amplification circuit 400 may have at least one additional bank of amplifiers between the first bank and the second bank. In yet another embodiment, the additional bank of amplifiers may have additional averaging resistors similar to the configuration described above. It is understood that all embodiments described here may be implemented for a differential signal as well.

Figure 5:
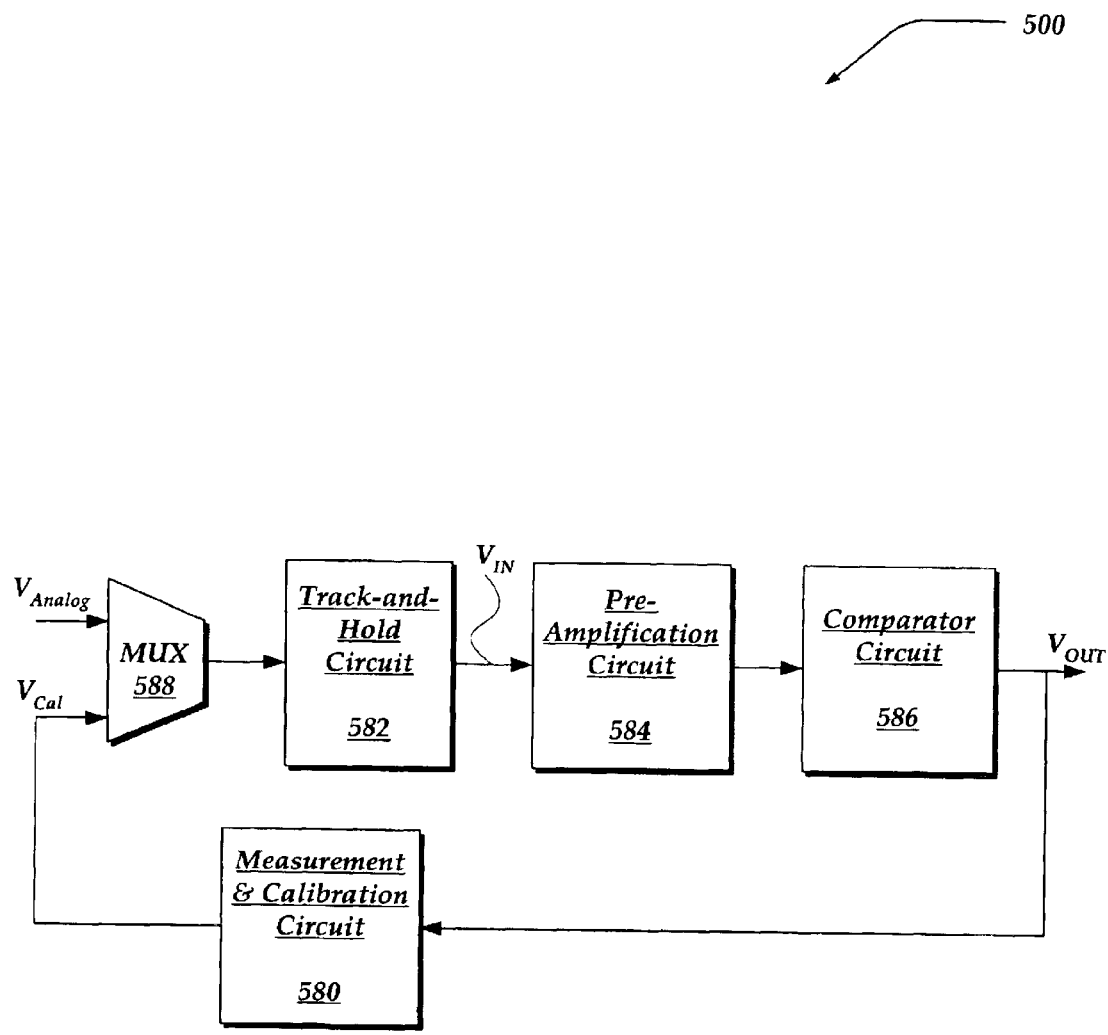
FIG. 5 illustrates a block diagram of an exemplary ADC, in which the present invention may operate.

FIG. 5 illustrates a block diagram of one embodiment of the inventive analog-to-digital converter circuit (500). Circuit 500 includes several components such as a multiplexer (MUX), an optional track-and-hold circuit 582, a pre-amplification circuit 584, a comparator circuit 586, and a measurement-and-calibration circuit 580. FIG. 5 shows the particular arrangement of inputs and outputs of the various components. In one embodiment, all of the components of circuit 500 are included in the same chip. Alternatively, one or more of the components of circuit 500 may be off-chip.

According to one embodiment, the ADC may be calibrated at designated times. However, changes in operating temperature may distort the linearity of the ADC due to mismatches between resistor temperature characteristics and amplifier transconductances. A termination resistor with temperature coefficient pre-selected to compensate for ADC non-linearity may provide the desired stability over the temperature range. Furthermore, two or more resistors with different temperature coefficients may be employed in place of one to better approximate the desired temperature coefficient.

In one embodiment, measurement-and-calibration circuit 580 evaluates an output of each comparator in comparator circuit 586 and modifies the analog calibration signal performing calibration of the ADC. Once the circuit is calibrated further stability of linearity over temperature ranges is established, in part, by the termination resistors.

During standard operation, an analog signal ($V_{Analog}$) ia provided to optional track-and-hold circuit 582 through a multiplexer. Pre-amplification circuit 584 receives the signal provided by track-and-hold circuit 582, amplifies, and forwards it to comparator circuit 586. Comparator circuit 586 performs a comparison function and provides output signal (OUT) to an encoder circuit (not shown). Again, stability of linearity over temperature ranges is provided, in part, by the termination resistors.

In one embodiment, track-and-hold circuit 582 is a switched capacitor circuit, and the like. A folding ADC may include pre-amplification circuit 584 with one or more folding stages. A flash ADC may include pre-amplification circuit 584 with no folding stages.

The above specification, examples and data provide a description of the manufacture and use of the composition of the invention. Since many embodiments of the invention can be made without departing from the spirit and scope of the invention, the invention also resides in the claims hereinafter appended.

We claim:

1. A circuit for analog-to-digital conversion, comprising:
   a first pre-amplification circuit, comprising a plurality of amplifiers;
   a second pre-amplification circuit, comprising another plurality of amplifiers, that is coupled to the first pre-amplification circuit;
   a series of averaging resistors coupled between an output of each amplifier of the first pre-amplification circuit; and
   a termination resistor circuit coupled between a terminal of a termination voltage source and an output of a first amplifier of the first pre-amplification circuit.

2. The circuit of claim 1, further comprising an additional termination resistor circuit coupled between another terminal of the termination voltage source and an output of a last amplifier of the plurality of amplifiers.

3. The circuit of claim 1, further comprising at least one additional pre-amplification circuit comprising yet another plurality of amplifiers and one additional associated series of averaging resistors coupled between an output of each amplifier of the additional pre-amplification circuit.

4. The circuit of claim 1, wherein the termination resistor circuit further comprises a resistor with a predetermined temperature coefficient such that a temperature dependent increase in current flow to the output of the first amplifier is substantially reduced.

5. The circuit of claim 4, wherein the termination resistor circuit further comprises at least two resistors arranged such that a total temperature coefficient provides substantial reduction of a temperature dependent increase in current flow to the output of the first amplifier.

6. The circuit of claim 1, wherein a temperature coefficient of the termination resistor is predetermined such that a linearity of a transfer curve of the analog-to-digital conversion circuit is substantially stable over a temperature range.

7. The circuit of claim 6, wherein the temperature range includes at least twenty-five degrees above a designated operating temperature and twenty-five degrees below the designated operating temperature of the analog-to-digital conversion circuit.

8. The circuit of claim 1, further comprising a series of interpolation resistors coupled between an output of each amplifier of the second pre-amplification circuit at a second series of nodes, wherein at least three interpolation resistors are placed between any two amplifiers a comparator circuit, and wherein the second series of nodes are coupled to an input of a comparator in a comparator circuit is coupled to the second pre-amplification circuit at a predetermined ratio.

9. The circuit of claim 8, wherein the predetermined ratio is three to one.

10. A circuit for analog-to-digital conversion, comprising:
    a first pre-amplification circuit, comprising a plurality of amplifiers;

a second pre-amplification circuit, comprising a plurality of amplifiers, that is coupled to the first pre-amplification circuit;

a series of averaging resistors coupled between an output of each amplifier of the first pre-amplification circuit;

a second series of averaging resistors coupled between an output of each amplifier of the second pre-amplification circuit at a second series of nodes; and a termination resistor circuit coupled between a terminal of a termination voltage source and an output of a first amplifier of the first pre-amplification circuit.

11. The circuit of claim 10, further comprising:

a comparator circuit comprising a plurality of comparators, wherein an input of each comparator is coupled to a node in the second series of nodes.

12. The circuit of claim 10, further comprising at least one additional pre-amplification circuit comprising a plurality of amplifiers and one additional associated series of averaging resistors coupled between an output of each amplifier of the additional pre-amplification circuit.

13. The circuit of claim 12, further comprising at least one additional termination resistor circuit coupled to the output of the first and last amplifiers of the additional pre-amplification circuit, wherein the additional termination resistors are also coupled to the terminals of the termination voltage source.

14. The circuit of claim 10, wherein a temperature coefficient of the termination resistor is selected such that a linearity of a transfer curve of the analog-to-digital conversion circuit is substantially stable over a temperature range.

15. The circuit of claim 10, wherein a number of amplifiers in the pre-amplification circuit is determined by a desired resolution of an output digital signal.

16. The circuit of claim 10, wherein the amplifiers comprise transistor pairs, each of the respective transistor pair further comprising a respective current source that is arranged to drive the pair.

17. The circuit of claim 16, wherein the transistor pairs further comprise at least one of a BJT transistor pair, a FET transistor pair, and a CMOS transistor pair.

18. A method for improving temperature stability of an analog-to-digital conversion circuit, the method comprising:

providing at least one termination resistor coupled between a terminal of a termination voltage source and an output of a first amplifier of a pre-amplification circuit of the analog-to-digital conversion circuit; and providing at least another termination resistor coupled between another terminal of the termination voltage source and an output of a last amplifier of the pre-amplification circuit of the analog-to-digital conversion circuit.

19. The method of claim 18, wherein a temperature coefficient of the termination resistor is selected such that a linearity of a transfer curve of the analog-to-digital conversion circuit is substantially stable over a temperature range.

20. A method for determining a digital value of an analog signal, the method comprising:

receiving an analog signal through an input of an amplifier in a first pre-amplification circuit;

forwarding the signal to a second pre-amplification circuit, further comprising the steps of:

averaging an output of the first pre-amplification circuit by coupling averaging resistors between outputs of the amplifiers of the first pre-amplification circuit, and substantially stabilizing a linearity of the first pre-amplification circuit by coupling at least one termination resistor to an output of a first and a last amplifier of the pre-amplification circuit, wherein the termination resistors are also coupled to terminals of a termination voltage source; and performing a comparison on the pre-amplified analog signal in a comparator circuit that is coupled to the second pre-amplification circuit.

21. A circuit with an analog-to-digital conversion architecture, comprising:

means for providing a first pre-amplification comprising a plurality of amplifying means;

means for providing a second pre-amplification with a folding analog-to-digital converter architecture comprising a plurality of amplifying means;

means for providing averaging between outputs of each amplifying means in the first pre-amplification means at a first series of nodes;

means for providing a termination load between a terminal of a termination voltage means and an output of a first amplifying means of the first pre-amplification means;

means for providing a termination load between another terminal of a termination voltage means and an output of a last amplifying means of the first pre-amplification means; and means for comparing to convert analog signal to digital signal, coupled to an output of the second pre-amplification means.

* * * * *